May 31, 1960 A. C. SHECKLER 2,938,357

METHOD AND APPARATUS FOR MOUNTING THERMOELECTRIC ELEMENT

Filed May 8, 1959

*INVENTOR.*
ADDISON C. SHECKLER

*BY* Herman Seid

ATTORNEY.

2,938,357

METHOD AND APPARATUS FOR MOUNTING THERMOELECTRIC ELEMENT

Addison C. Sheckler, Cato, N.Y., assignor to Carrier Corporation, Syracuse, N.Y., a corporation of Delaware Filed May 8, 1959, Ser. No. 811,893

6 Claims. (Cl. 62—3)

This invention relates to thermoelectric apparatus and more particularly to a method and structure for mounting thermoelectric elements in a thermoelectric apparatus in a manner to minimize breakage of the thermoelectric elements.

Various constructions have been proposed heretofore for mounting thermoelectric elements in thermoelectric apparatus such as electrical generators or refrigerators. It has been necessary in these prior art constructions to take particular care to mount the thermoelectric elements in a position where they will not be subjected to considerable linear stress because the elements are frequently composed of a material which has very low resistance to breakage. It has been found, however, that thermoelectric elements, while particularly subject to breakage when placed in tension or shear, have very good resistance to breakage when compressed volumetrically; that is, when an equal force is applied in all directions to the element.

It is the principal object of this invention to provide a method and means for mounting thermoelectric elements in a thermoelectric apparatus in a manner to minimize breakage thereof under the influence of external forces.

These and other objects of this invention which will become apparent by reference to the following description and drawings, are achieved by mounting the thermoelectric elements in a thermoelectric apparatus and surrounding them by a relatively incompressible fluid whereby external forces acting on the thermoelectric apparatus will be transmitted to the thermoelectric elements equally in all directions to achieve volumetric compression of the thermoelectric elements.

Figure 2:
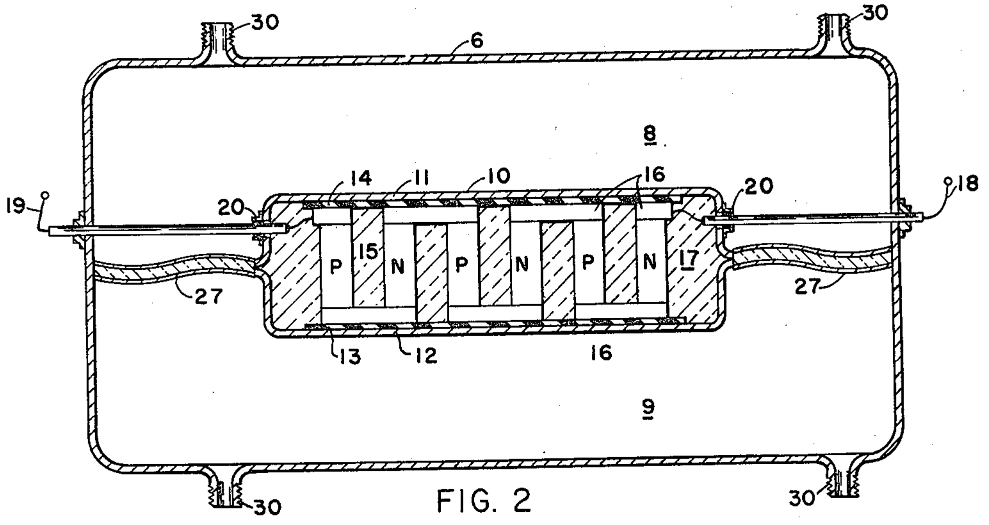
Figure 1:
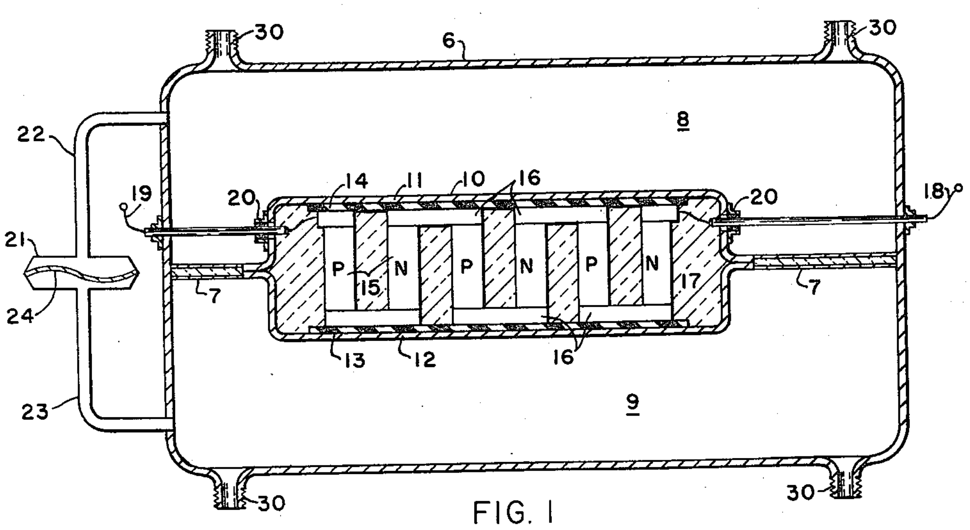

Figure 1 is a cross-sectional view of a thermoelectric apparatus embodying my invention; and Figure 2 is a cross-sectional view through a thermoelectric apparatus embodying a modification of my invention.

Referring specifically to the drawings wherein like numerals are employed to designate like elements, Figure 1 shows a cross-section through a thermoelectric apparatus having an outer shell 6. Shell 6 is divided into an exterior heat exchange chamber 9 and interior heat exchange chamber 8 by a rigid partition 7 supporting a thermoelectric panel designated generally 10. Partition 7 may desirably comprise a double wall assembly separated by a sheet of thermal insulation as shown in Figure 1. The thermoelectric panel comprises a housing having one pressure plate 11 and another pressure plate 12. Disposed within the housing of the thermoelectric panel 10 are a plurality of thermoelectric elements 15 of some suitable material such as bismuth selenide or bismuth telluride having dissimilar thermoelectric properties joined in series by a plurality of jumpers 16 alternating between P-type elements and N-type elements as is conventional in the art. When current passes through the dissimilar thermoelectric elements, the hot junctions will be adjacent one side of the panel and the cold junctions will be adjacent the other side. Separating the jumpers 16 from pressure plates 11 and 12 are a pair of sheets of electrical insulation 13 and 14.

Also within the housing of the thermoelectric panel 10 is a filler material 17 which surrounds the thermoelectric elements 15 and substantially fills the remaining space within the housing. The filler material 17 comprises an open cell foam of any suitable composition such as cellulose foam. By an open cell foam is meant a material having a large number of relatively small cells, the walls of which are broken and in communication with other cells of the foam. The filler material 17 also comprises an incompressible liquid of some suitable material such as benzene which fills the open cells of the foam and excludes substantially all of the compressible gases such as air from both the foam and the housing of the thermoelectric panel.

Electric leads 18 and 19 connected to the thermoelectric elements are brought out of the housing of the thermoelectric panel 10 through a pair of hermetic seals 20 which may be of any commonly available type. After the thermoelectric panel is filled with the incompressible fluid, it is hermetically sealed to prevent the escape of fluid from the housing or the entrance of compressible gases into the housing. Fluid inlet and outlet connections 30 are provided for both interior chamber 8 and exterior chamber 9. Pipes 22 and 23 communicating respectively with interior chamber 8 and exterior chamber 9 are connected with pressure equalizer 21 having a diaphragm 24.

The embodiment shown in Figure 2 is generally similar to that shown in Figure 1 except that the housing of the thermoelectric panel 10 is supported in the shell 6 of the thermoelectric apparatus by means of a flexible insulated partition 27 and the pressure equalizer 21 as shown in Figure 1 is omitted. As in the preceding embodiment, the housing of the thermoelectric panel 10 contains a plurality of thermoelectric elements 15 connected by jumpers 16 which are separated from pressure plates 11 and 12 by sheets of electrical insulation 13 and 14. Filler material 17 comprising an open cell foam of suitable material and an incompressible liquid substantially fills the interior of the thermoelectric panel. The shell is hermetically sealed.

It will be understood that the thermoelectric panel 10 described can be employed either as an electric generator or as a means to provide heating or refrigeration. If, for example, it is desired to use the panel 10 in a refrigeration system, current would be supplied to the thermoelectric elements 15 through leads 18 and 19. Assuming that the current flows through the panel in a direction such that the junctions nearer interior chamber 8 are relatively cold and those nearer exterior chamber 9 are the relatively hot, a fluid is passed through exterior chamber 9 by means of the inlet and outlet 30 in contact with pressure plate 12. Under such circumstances the fluid passed in exterior chamber 9 will be in heat exchange relation with the adjacent hot junctions of the thermoelectric elements. Similarly, a second fluid is passed through interior chamber 8 in heat exchange relation with the adjacent cold junctions of thermoelectric elements 15. This second fluid may be a brine solution which will be cooled by giving up a portion of its heat to the cold junctions as it passes through interior chamber 8. The brine may then be circulated to any desired location for the purposes of refrigeration and be returned to the interior chamber for cooling and recirculation.

In order to obtain efficient refrigeration, it will be understood that the fluid circulated in exterior heat exchange chamber 9 should be a readily available fluid which has as low a temperature as is practical to obtain. If the refrigeration system is being operated in a submarine, for example, it may be desirable to use sea water as the heat exchange fluid in chamber 9. It will also be appreciated, however, that due to submergence the pressure in the exterior heat exchange chamber 9 may be quite high, 300 p.s.i., for example, and this pressure acting on the thermoelectric panel 10 will place considerable stress on the thermoelectric elements 15 contained therein. Materials which are commonly used as thermoelectric elements such as bismuth selenide or bismuth telluride are characteristically brittle and unable to withstand excessive linear forces such as encountered when in compression or shear. However, these materials are able to withstand substantial volumetric compression without breaking. Since the thermoelectric elements 15 in the thermoelectric panel described are completely surrounded by an incompressible fluid, the submergence pressure which may be exerted on the pressure plate 12 of the thermoelectric housing will be transmitted by the incompressible fluid equally in all directions to the thermoelectric elements and tend to produce volumetric compression of the elements.

It is desirable that the liquid chosen to fill the housing 10 of the thermoelectric panel be substantially incompressible in order to effectively transmit pressure equally against all surfaces with which it is in contact. The fluid must also have a low coefficient of thermal conductivity since it is desirable to maintain as large as possible the temperature difference between the hot and cold junctions of the thermoelectric elements 15 for efficient operation of the system. The incompressible liquid chosen should desirably have a vapor pressure lower than atmospheric, should be reasonably non-corrosive and should not dissolve or react with the open celled foam with which it is used.

Even with a liquid of low thermal conductivity, precautions should be taken to prevent convection currents from being set up within the liquid which would tend to reduce the temperature difference between the hot and cold junctions of the thermoelectric elements. For this reason, I find it desirable to substantially fill the interior of housing 10 with an open cell foam. The open cell nature of the foam permits the incompressible liquid to seep through the foam and completely fill the cells while the labyrinthine nature of the open cell foam substantially prevents convection from taking place within the fluid. Examples of suitable combinations of incompressible fluid and open cell foam suitable for the purposes of this invention are benzene employed with cellulose foam, carbon tetrachloride or trichlorotrifluoroethane (Freon 113) with a polyester or epoxy resin foam.

In assembling the thermoelectric panel the thermoelectric elements 15 are positioned within the housing 10 either by inserting them in the housing as a unit with the insulation sheets 13 and 14 or by assembling the housing about the thermoelectric elements and the insulation.

The open cell foam material may then be foamed in place about the thermoelectric elements if desired. It will be understood, of course, that the order of assembly is not important and that the open cell foam can be molded to the desired shape prior to the assembly of the thermoelectric elements and the elements thereafter assembled in it prior to being positioned within the housing 10. The housing 10 is then completely filled with the incompressible liquid and hermetically sealed to prevent the entrance of compressible fluid such as air or the escape of the incompressible fluid from within the housing.

When the thermoelectric panel is employed in a shell having two compartments such as shown in the drawings, where one compartment may be subjected to a high pressure as in a submarine application, care must be taken to see that the pressures on each side of the housing of the thermoelectric panel are equal since otherwise the panel may be bowed into the compartment having the lower pressure. This deformation of the panel would tend to produce breakage of the thermoelectric elements therein. The pressure equalizer 21 as shown in Figure 1 equalizes the pressure between interior chamber 8 and exterior chamber 9 through the action of the fluid pressure operating on diaphragm 24 which is suitably sized for the compressibility of the fluids in the chambers 8 and 9. In the embodiment shown in Figure 2 the separate pressure equalizer is replaced by a flexible wall portion 27 which serves in the same way as equalizer 21 to transmit the pressure of the fluid in chamber 9 to that of the fluid in chamber 8 without permitting communication between the fluids or excessive bending of the housing.

It can be seen, therefore, that by the method described and the apparatus shown, I am able to successfully employ the thermoelectric panel of my invention under conditions which would otherwise result in breakage of the thermoelectric elements.

While I have described a preferred embodiment of the invention, it will be understood the invention is not limited thereto since it may be otherwise employed within the scope of the following claims.

I claim:

1. In a thermoelectric apparatus, a panel mounting assembly comprising a plurality of pairs of dissimilar thermoelectric elements connected at their ends by jumpers, a housing containing said thermoelectric elements, insulation between and in contact with said housing and said jumpers, said housing being hermetically sealed and adapted to be exposed to external pressure, and a substantially incompressible liquid substantially filling the interior of said housing and excluding compressible fluids therefrom and surrounding said thermoelectric elements whereby external forces acting on said housing are transmitted by said incompressible liquid to said thermoelectric elements to apply forces to said elements tending to compress them volumetrically.

2. A thermoelectric apparatus as described in claim 1 wherein said thermoelectric elements are also surrounded with an open cell foam positioned in said housing, said incompressible liquid substantially filling the open cells of said foam, said foam being adapted to inhibit heat transfer within the housing by inhibiting convection in the incompressible liquid.

3. A thermoelectric apparatus as described in claim 1 wherein said panel mounting assembly is contained within a shell, a partition supporting said panel and dividing said shell into a pair of heat exchange chambers, a fluid within each said heat exchange chamber in heat exchange relation with said panel and means adapted to equalize differences in pressure between the fluids contained within said heat exchange chambers whereby bowing of said panel is substantially eliminated.

4. A method of mounting thermoelectric elements in a thermoelectric apparatus which are more subject to breakage when subjected to linear stresses than when subjected to forces tending to produce volumetric compression, comprising the steps of positioning the thermoelectric elements within a housing, surrounding the thermoelectric elements with a substantially incompressible liquid by substantially completely filling the housing the said liquid substantially excluding compressible fluids from said housing and hermetically sealing said shell whereby external forces exerted on said housing are transmitted equally to said elements in all directions to provide forces tending to produce volumetric compression of said elements.

5. A method of mounting thermoelectric elements in a thermoelectric apparatus which are more subject to breakage when subjected to linear stresses than when subjected to volumetric compression comprising the steps of positioning the thermoelectric elements within a housing, positioning an open cell foam within said housing about said thermoelectric elements, surrounding said thermoelectric elements with a substantially incompressible liquid by substantially filling the housing with said liquid and causing the liquid to substantially fill the voids in the open cell foam thereby substantially excluding compressible fluids from the shell and hermetically sealing said shell whereby external forces exerted on said housing are transmitted equally to said elements in all directions to provide forces tending to produce volumetric compression of said elements.

6. A method of mounting thermoelectric elements subject to breakage when subjected to linear stresses in a thermoelectric apparatus comprising the steps of positioning the thermoelectric elements in a housing, surrounding the thermoelectric elements with an incompressible liquid substantially filling the housing and excluding compressible fluids therefrom, hermetically sealing said housing, mounting said housing on a partition wall dividing a pair of heat exchange chambers and equalizing the pressure in each chamber.

References Cited in the file of this patent

UNITED STATES PATENTS

| | | |
|---|---|---|
| 2,289,152 | Telkes | July 7, 1942 |
| 2,870,610 | Lindenblad | Jan. 27, 1959 |
| 2,898,743 | Bradley | Aug. 11, 1959 |